US012660317B2

(12) United States Patent
Song et al.

(10) Patent No.:     US 12,660,317 B2
(45) Date of Patent:         Jun. 16, 2026

(54) DISPLAY SUBSTRATE, METHOD FOR MANUFACTURING SAME, AND DISPLAY DEVICE

(71) Applicants:Chengdu BOE Display Sci-tech Co., Ltd., Chengdu (CN); BOE TECHNOLOGY GROUP CO., LTD., Beijing (CN)

(72) Inventors: Zike Song, Beijing (CN); Liangliang Li, Beijing (CN); Mengxin Rong, Beijing (CN); Jian Wang, Beijing (CN); Hui Tang, Beijing (CN); Yundong Tai, Beijing (CN); Shuangshuang Cai, Beijing (CN); Xiaoqiang Yi, Beijing (CN)

(73) Assignees: Chengdu BOE Display Sci-tech Co., Ltd., Sichuan (CN); BOE TECHNOLOGY GROUP CO., LTD., Beijing (CN)

( * ) Notice:    Subject to any disclaimer, the term of this patent is extended or adjusted under 35 U.S.C. 154(b) by 431 days.

(21) Appl. No.:    18/024,594

(22) PCT Filed:    Apr. 26, 2022

(86) PCT No.:    PCT/CN2022/089268
§ 371 (c)(1),
(2) Date:    Mar. 3, 2023

(87) PCT Pub. No.:  WO2023/206071
PCT Pub. Date: Nov. 2, 2023

(65)    Prior Publication Data
US 2024/0282778 A1    Aug. 22, 2024

(51) Int. Cl.
H10D 86/60    (2025.01)
H10D 86/01    (2026.01)
H10D 86/40    (2025.01)

(52) U.S. Cl.
CPC ......... H10D 86/60 (2025.01); H10D 86/0221 (2025.01); H10D 86/423 (2025.01); H10D 86/441 (2025.01)

(58) Field of Classification Search
CPC .......................... H10D 86/423; H01L 23/5221
See application file for complete search history.

(56)    References Cited

U.S. PATENT DOCUMENTS

| | | |
|---|---|---|
| 2009/0153020 A1 | 6/2009 | Ito et al. |
| 2013/0161631 A1 | 6/2013 | Lee et al. |
| | (Continued) | |

FOREIGN PATENT DOCUMENTS

| | | |
|---|---|---|
| CN | 101459028 A | 6/2009 |
| CN | 103178082 A | 6/2013 |
| | (Continued) | |

*Primary Examiner* — Amar Movva
(74) *Attorney, Agent, or Firm* — WHDA, LLP

(57)    ABSTRACT

The present disclosure provides a display substrate, a method for manufacturing the same, and a display device, which belongs to the technical field of displays. The display substrate includes: a first signal line, located on a base substrate and extending in a first direction; a second signal line, located on the base substrate and extending in a second direction, where the second signal line is arranged in a different layer from the first signal line, the second direction intersects with the first direction, the first signal line includes a first portion, and a first orthographic projection of the first portion on the base substrate is located within a orthographic projection of the second signal line on the base substrate; the display substrate further includes: an isolation pattern, located on a side of the first signal line away from the base substrate.

15 Claims, 6 Drawing Sheets

(56) References Cited

U.S. PATENT DOCUMENTS

2019/0181161 A1    6/2019   Li
2021/0167098 A1*   6/2021   Liu ....................... H10D 86/451

FOREIGN PATENT DOCUMENTS

| CN | 107230661 A | 10/2017 |
| CN | 110148601 A | 8/2019 |
| CN | 107293593 B | 9/2019 |
| CN | 114068661 A | 2/2022 |

* cited by examiner

DISPLAY SUBSTRATE, METHOD FOR MANUFACTURING SAME, AND DISPLAY DEVICE

CROSS-REFERENCE TO RELATED APPLICATION

The present application is the U.S. national phase of PCT Application No. PCT/CN2022/089268 filed on Apr. 26, 2022, the entire contents of which are hereby incorporated by reference.

TECHNICAL FIELD

The present disclosure relates to the technical field of displays, and more particularly, relates to a display substrate, a method for manufacturing the same, and a display device.

BACKGROUND

In related art, signal lines of a display substrate are generally made of cuprum (Cu), signal lines of different layers intersect with each other, and an insulating layer is provided between the signal lines of different layers at an intersection position. However, the signal lines are prone to Cu ion diffusion and Cu ion penetrating the insulating layer may cause a short circuit between the signal lines of different layers, affecting a product yield of the display substrate.

SUMMARY

The technical problem to be solved in the present disclosure is to provide a display substrate, a method for manufacturing the same, and a display device, which can ensure the product yield of the display substrate.

In order to solve the above technical problem, the technical solutions provided by embodiments of the present disclosure are as follows.

In one aspect, a display substrate is provided, including:
a first signal line, located on a base substrate and extending in a first direction;
a second signal line, located on the base substrate and extending in a second direction, where the second signal line is arranged in a different layer from the first signal line, the second direction intersects with the first direction,
the first signal line includes a first portion, and a first orthographic projection of the first portion on the base substrate is located within an orthographic projection of the second signal line on the base substrate;
the display substrate further includes:
an isolation pattern, located on a side of the first signal line away from the base substrate, where the isolation pattern is located on a side of the second signal line close to the base substrate, and the first orthographic projection is located in a second orthographic projection of the isolation pattern on the base substrate.

In some embodiments, the display substrate further includes:
an insulating layer, located between the first signal line and the second signal line,
where the isolation pattern is located on a side of the insulating layer close to the base substrate: or
the isolation pattern is located on a side of the insulating layer away from the base substrate.

In some embodiments, the isolation pattern is made of a semiconductor material.

In some embodiments, the isolation pattern is made of a metal oxide semiconductor.

In some embodiments, an active layer of a thin film transistor of the display substrate is arranged in the same layer and material as the isolation pattern.

In some embodiments, the first signal line includes a second portion other than the first portion, and an orthographic projection of the second portion on the base substrate does not overlap with an orthographic projection of the second signal line on the base substrate.

In some embodiments, in the second direction, a boundary of the second orthographic projection exceeds a boundary of the first orthographic projection and the minimum distance between the boundary of the first orthographic projection and the boundary of the second orthographic projection is greater than 0.2 microns.

In some embodiments, in the first direction, the boundary of the second orthographic projection exceeds the boundary of the first orthographic projection and the minimum distance between the boundary of the first orthographic projection and the boundary of the second orthographic projection is greater than 0.2 microns.

In some embodiments, the first signal line includes a plurality of the first portions which are independent from each other, each of the first portions corresponds to one isolation pattern, a first orthographic projection of the first portion on the base substrate falls within a second orthographic projection of the corresponding isolation pattern on the base substrate, and a plurality of isolation patterns corresponding to the same first signal line are integrally structured.

In some embodiments, the first signal line is a gate line and the second signal line is a data line: or
the first signal line is a first clock signal line and the second signal line is a second clock signal line.

A display device is provided by the embodiments of the present disclosure, including the above display substrate.

A method for manufacturing a display substrate is provided by the embodiments of the present disclosure, including:
forming a first signal line extending in a first direction on a base substrate;
forming a second signal line extending in a second direction on the base substrate, where the second signal line is arranged in a different layer from the first signal line, the second direction intersects with the first direction, the first signal line includes a first portion, and a first orthographic projection of the first portion on the base substrate is located within an orthographic projection of the second signal line on the base substrate; and
forming an isolation pattern on a side of the first signal line away from the base substrate, where the isolation pattern is located on a side of the second signal line close to the base substrate, and the first orthographic projection is located in a second orthographic projection of the isolation pattern on the base substrate.

In some embodiments, the method specifically includes:
forming an active layer of a thin film transistor of the display substrate and the isolation pattern by one patterning process.

Embodiments of the present disclosure have the following beneficial effects.

In the above solution, an isolation pattern is provided between the first signal line and the second signal line, and the isolation pattern can block metal ion diffusion of the first signal line and the second signal line, slow down the metal ion diffusion and chemical reaction between crossing metal signal lines due to an action of an electric field, and ensure the product yield of the display substrate.

REFERENCE NUMERALS

01: first signal line
011: first portion
02: second signal line
03: isolation pattern
021: hollowed-out region
04: insulating layer
06: via
07: first clock signal line
08: second clock signal line

DETAILED DESCRIPTION

In order to make the technical problems, technical solutions, and advantages of the embodiments of the present disclosure more apparent, technical solutions of the embodiments of the present disclosure will be described clearly and completely with reference to the drawings and specific embodiments.

A display substrate, a method for manufacturing the same, and a display device are provided in the embodiments of the present disclosure, to ensure the product yield of the display substrate.

Figure 1:
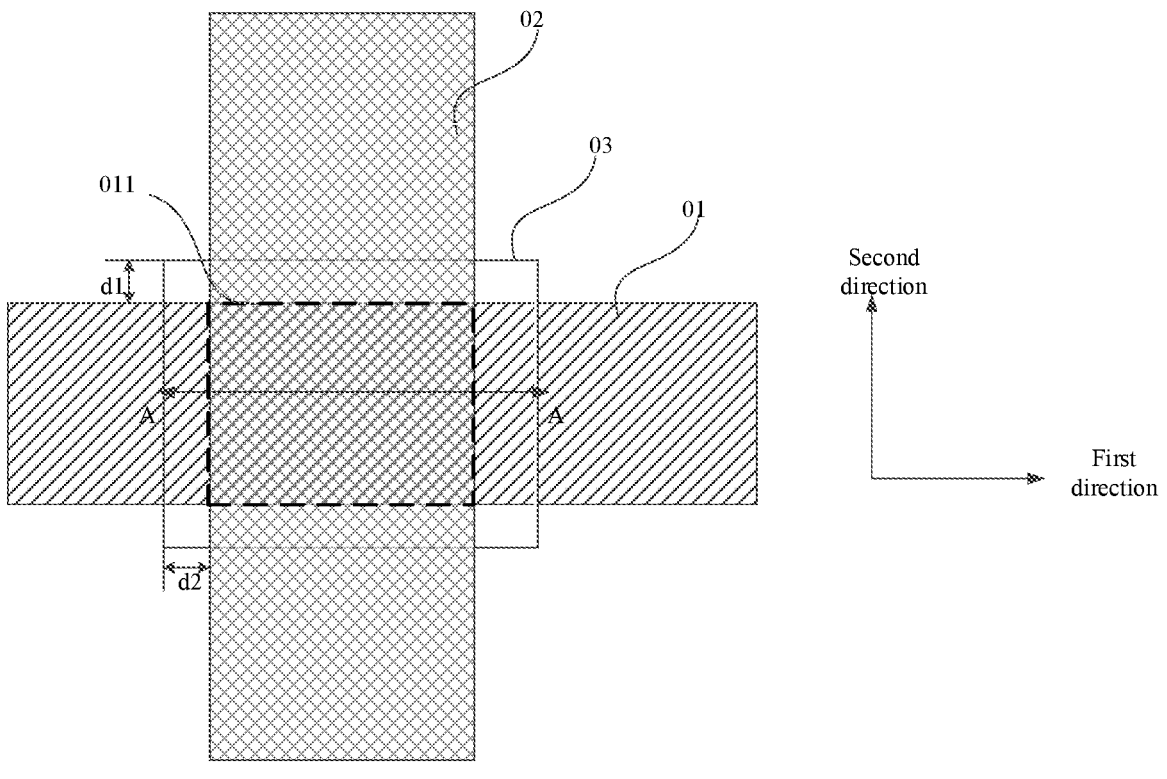
FIG. 1 is a schematic plan view of a display substrate according to embodiments of the present disclosure.

Embodiments of the present disclosure provide a display substrate, as shown in FIG. 1, including:

a first signal line 01 located on a base substrate and extending in a first direction;

a second signal line 02 located on the base substrate and extending in a second direction, where the second signal line 02 is arranged in a different layer from the first signal line 01, the second direction intersects with the first direction, the first signal line 01 includes a first portion (a portion in a dotted line frame), and a first orthographic projection of the first portion on the base substrate is located within a orthographic projection of the second signal line 02 on the base substrate;

the display substrate further including:

an isolation pattern 03 located on a side of the first signal line 01 away from the base substrate, where the isolation pattern is located on a side of the second signal line 02 close to the base substrate and the first orthographic projection is located in a second orthographic projection of the isolation pattern on the base substrate.

In this embodiment, an isolation pattern is provided between the first signal line and the second signal line, and the isolation pattern can block metal ion diffusion of the first signal line and the second signal line, slow down metal ion diffusion and chemical reaction between crossing metal signal lines due to an action of an electric field, and ensure the product yield of the display substrate.

Figure 2:
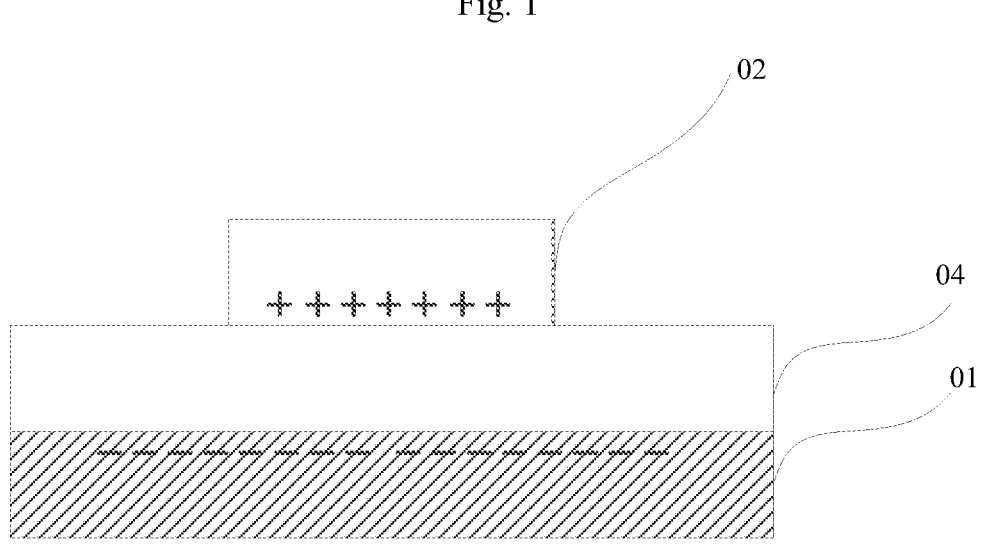
FIG. 2 is a schematic cross-sectional view of a display substrate in the related art.

Due to the good conductivity of Cu, signal lines of the display substrate are generally made of Cu, which include a first signal line and a second signal line. As shown in FIG. 2, in the related art, an insulating layer 03 is provided between a first signal line 01 and a second signal line 02 and the insulating layer 03 is generally made of silicon oxide, silicon nitride, or silicon oxynitride. Limited by a manufacturing process, thickness of the insulating layer 03 is relatively small, and metal ion diffusion occurs in the first signal line 01 and the second signal line 02, resulting in that the first signal line 01 and the second signal line 02 have a risk of a short circuit at an intersection position between the first signal line 01 and the second signal line 02. After the short circuit occurs, temperature at the intersection position of the signal lines will be increased, thus causing the insulating layer at the intersection position of the signal lines to be easily damaged, damaging sealing performance of the display substrate, water vapor easily invading, corroding the signal lines and causing chemical reactions, and water vapor also diffusing in the direction of the signal lines and reducing the product yield of the display substrate.

Figures 3, 4:
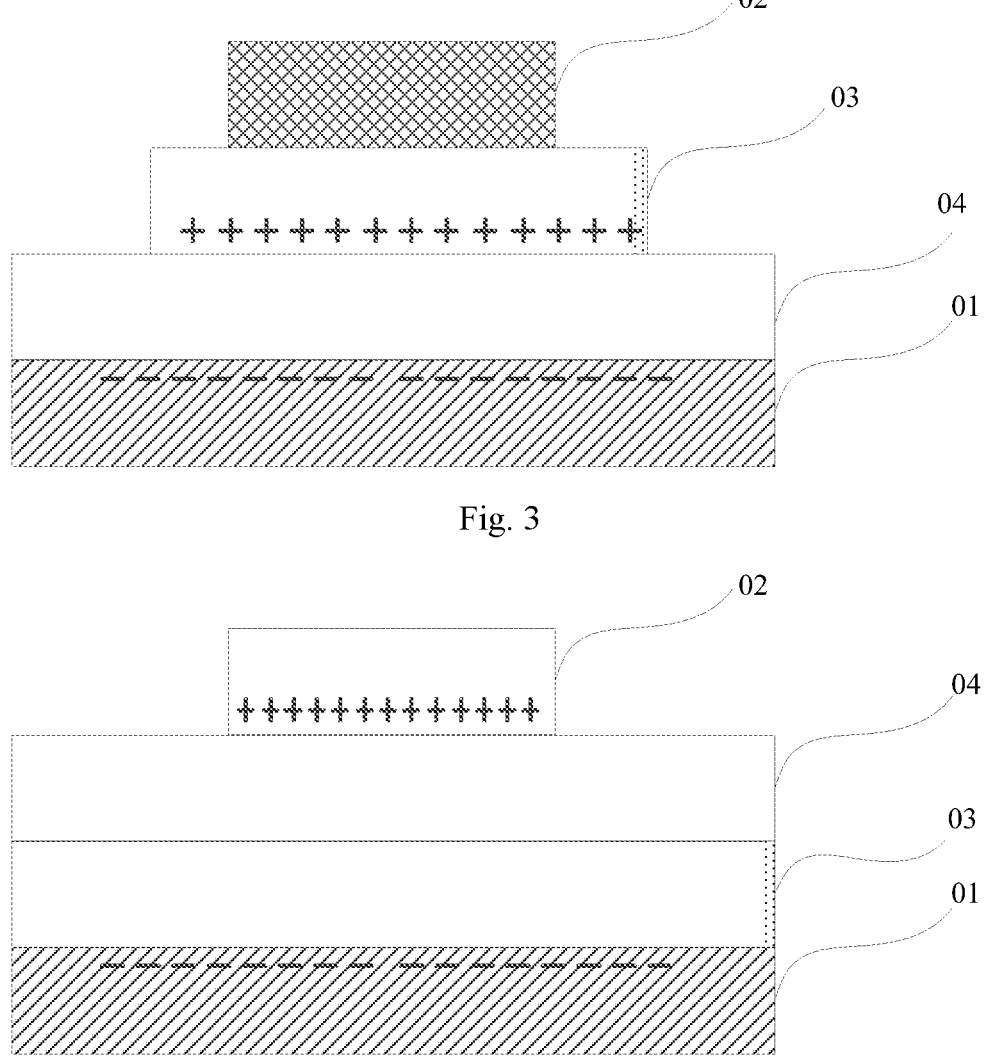
FIG. 3 and FIG. 4 are schematic cross-sectional views of the display substrate in a direction AA according to the embodiments of the present disclosure.

As shown in FIG. 3, in the present embodiment, an isolation pattern 03 is provided between the first signal line 01 and the second signal line 02, and the isolation pattern 03 has a certain thickness, which can block the metal ion diffusion of the first signal line 01 and the second signal line 02, slow down the metal ion diffusion and chemical reaction between crossing metal signal lines due to the action of an electric field, and ensure the product yield of the display substrate.

In some embodiments, the first signal line includes a second portion other than the first portion, and an orthographic projection of the second portion on the base substrate does not overlap with an orthographic projection of the second signal line on the base substrate. The orthographic projection of the first signal line at the intersection position of the signal lines on the base substrate is all located in the orthographic projection of the isolation pattern 03 on the base substrate. As shown in FIG. 1, the first orthographic projection of the first portion 011 (the portion inside the dotted line frame) on the base substrate is located in the orthographic projection of the isolation pattern 03 on the base substrate, and an area of the isolation pattern 03 is greater than an area of the first portion 011. As shown in FIG. 3, after metal ion diffusion occurs in the first signal line 01, metal ions are distributed on the isolation pattern 03. Since the area of the isolation pattern 03 is relatively large, the area of the isolation pattern 03 directly opposite the first signal line 01 is relatively large (compared with the area of the second signal line 02 directly opposite the first signal line 01), which can reduce a distribution density of metal ions and slow down the diffusion and chemical reaction of metal ions between crossing metal signal lines due to the action of an electric field. In contrast, after metal ion diffusion occurs in the second signal line 02, metal ions are distributed on the isolation pattern 03. Since the area of the isolation pattern 03 is relatively large, the area of the isolation pattern 03 directly opposite the second signal line 02 is relatively large (compared with the area of the first signal line 01 directly opposite the first signal line 01), which can reduce the distribution density of the metal ions can be reduced and slow down the diffusion and chemical reaction of the metal ions between crossing metal signal lines due to the action of the electric field.

As shown in FIG. 3, the isolation pattern 03 may be located between the insulating layer 04 and the second signal line 02: alternatively, as shown in FIG. 4, the isolation pattern 03 may be located between the insulating layer 04 and the first signal line 01 as long as the isolation pattern 03 is located between the first signal line 01 and the second signal line 02.

In order to ensure the waterproofness of the display substrate, the isolation pattern 03 may be made of a material having good waterproofness. In this embodiment, the isolation pattern 03 may be made of a semiconductor material, where the semiconductor material has a certain electron mobility. After the metal ions diffused in the signal lines reach the isolation pattern 03, the isolation pattern 03, as a semiconductor, may change electric field distribution, slow down the metal ion diffusion and chemical reaction between crossing metal signal lines due to the action of the electric field, avoid corrosion at the intersection position of the signal lines, and further avoid the diffusion of water vapor along the signal lines to ensure the yield of display products.

The isolation pattern 03 may be made of a metal oxide semiconductor, amorphous silicon, and polysilicon, and preferably, the isolation pattern 03 is made of a metal oxide semiconductor, such as indium gallium zinc oxide, (IGZO), which has a good electron mobility and can effectively reduce electric field density at the intersection position of the signal lines.

In some embodiments, an active layer of the thin film transistor of the display substrate is arranged in the same layer and material as the isolation pattern 03, so that the active layer of the thin film transistor of the display substrate and the isolation pattern 03 can be formed by one patterning process, and there is no need to prepare the isolation pattern 03 by a special patterning process, the number of patterning processes for preparing the display substrate can be reduced, and production cost of the display substrate can be reduced. The thickness of the isolation pattern 03 may be the same as a thickness of the active layer of the thin film transistor, and the thickness of the isolation pattern 03 may also be adjusted. The thickness of the isolation pattern 03 is designed to be greater than the thickness of the active layer of the thin film transistor to better reduce the electric field density at the intersection position of the signal lines, and the thickness of the isolation pattern 03 is preferably not less than 100 nm.

In order to better reduce the electric field density at the intersection position of the signal lines, as shown in FIG. 1, in the second direction, a boundary of the second orthographic projection exceeds a boundary of the first orthographic projection and the minimum distance d1 between the boundary of the first orthographic projection and the boundary of the second orthographic projection is greater than 0.2 microns. Thus, the isolation pattern 03 can spatially block the metal ion diffusion between the first signal line 01 and the second signal line 02. Also, since water vapor diffuses along the signal lines after corrosion of the signal lines, d1 greater than 0.2 microns can change the water vapor diffusion path and reduce the possibility of water vapor intrusion.

Further, d1 may be greater than a+0.2 microns, where a is a maximum fluctuation value of critical dimensions of the first signal line 01 and the isolation pattern 03 in the manufacturing process, which may reduce the influence of the manufacturing process on the product yield of the display substrate.

In order to better reduce the electric field density at the intersection position of the signal lines, as shown in FIG. 1, in the first direction, the boundary of the second orthographic projection exceeds the boundary of the first orthographic projection and the minimum distance d2 between the boundary of the first orthographic projection and the boundary of the second orthographic projection is greater than 0.2 microns. Thus, the isolation pattern 03 can spatially block the metal ion diffusion between the first signal line 01 and the second signal line 02. Also, since water vapor diffuses along the signal lines after corrosion of the signal lines, d1 greater than 0.2 microns can change the water vapor diffusion path and reduce the possibility of water vapor intrusion.

Further, d2 may be greater than b+0.2 microns, where b is the maximum fluctuation value of critical dimensions of the second signal line 02 and the isolation pattern 03 in the manufacturing process, which may reduce the influence of the manufacturing process on the product yield of the display substrate.

Figure 5:
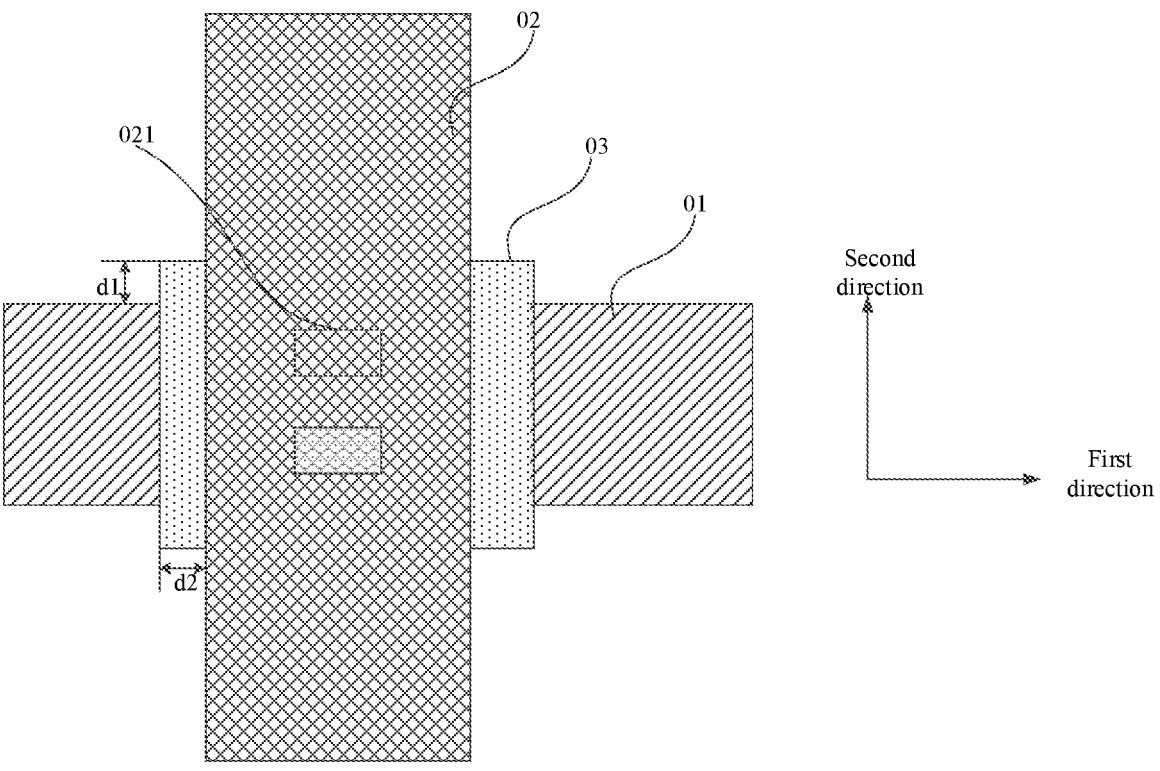
FIG. 5-FIG. 7 are schematic plan views of the display substrate according to specific embodiments of the present disclosure.
Figure 6:
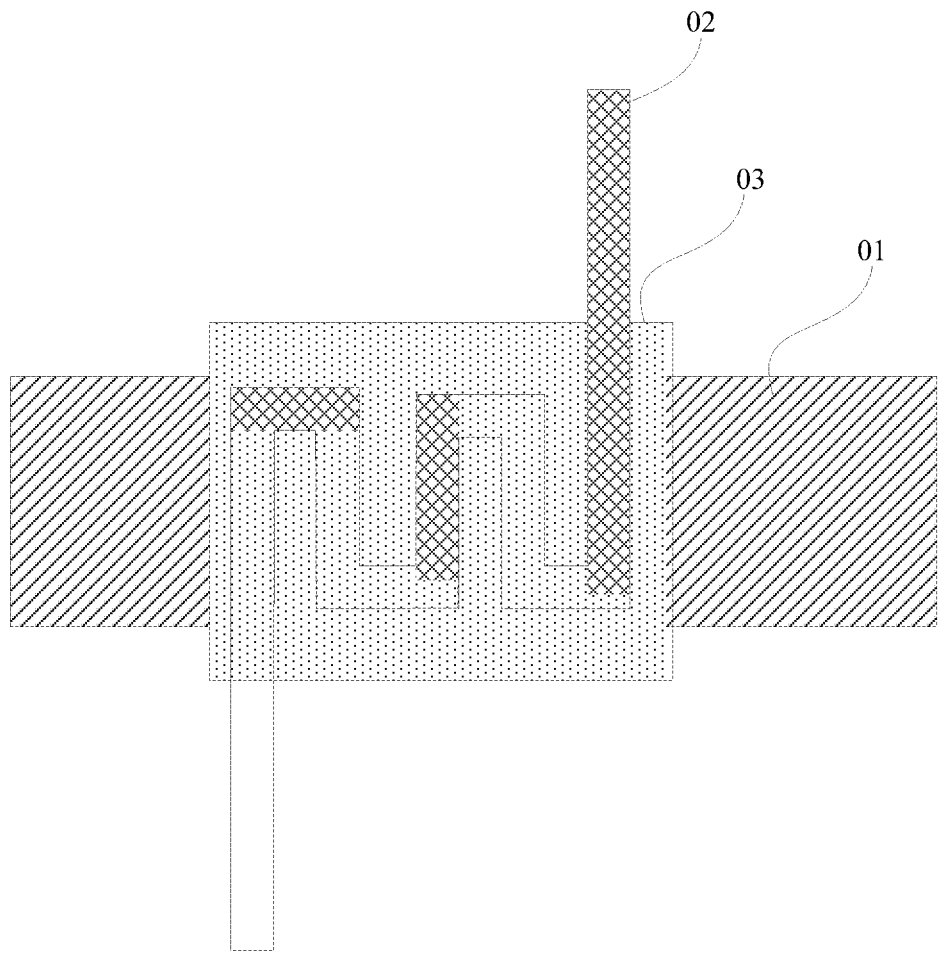

In this embodiment, the signal lines may be in various shapes. As shown in FIG. 1, the first signal line 01 and the second signal line 02 may be in a straight-line shape. As shown in FIG. 5, the second signal line 02 may further include a plurality of hollowed-out regions 021 at the intersection position of the signal lines, and the first signal line may also include a plurality of hollowed-out regions at the intersection position of the signal lines to reduce a direct area between the signal lines, reduce the electric field density at the intersection position of the signal lines, slow down the metal ion diffusion and chemical reaction between crossing metal signal lines due to the action of an electric field, avoid corrosion at the intersection position of the signal lines, and further avoid the diffusion of water vapor along the signal lines to ensure the yield of the display products. As shown in FIG. 6, the second signal line 02 may also be in a serpentine shape at the intersection position of the signal lines.

In the present embodiment, the first signal line is a gate line and the second signal line is a data line; or the first signal line is a first clock signal line and the second signal line is a second clock signal line. The first signal line is not limited to the gate line and the first clock signal line, the second signal line is not limited to the data line and the second clock signal line, and the first signal line and the second signal line may be other signal lines.

In the display region, the gate line intersects with the data line, an isolation pattern 03 is provided at the intersection position of the gate line and the data line, which can block the metal ion diffusion of the gate line and the data line, slow down the metal ion diffusion and chemical reaction between crossing metal signal lines due to the effect of an electric field, and ensure the product yield of the display substrate.

Figures 7, 8:
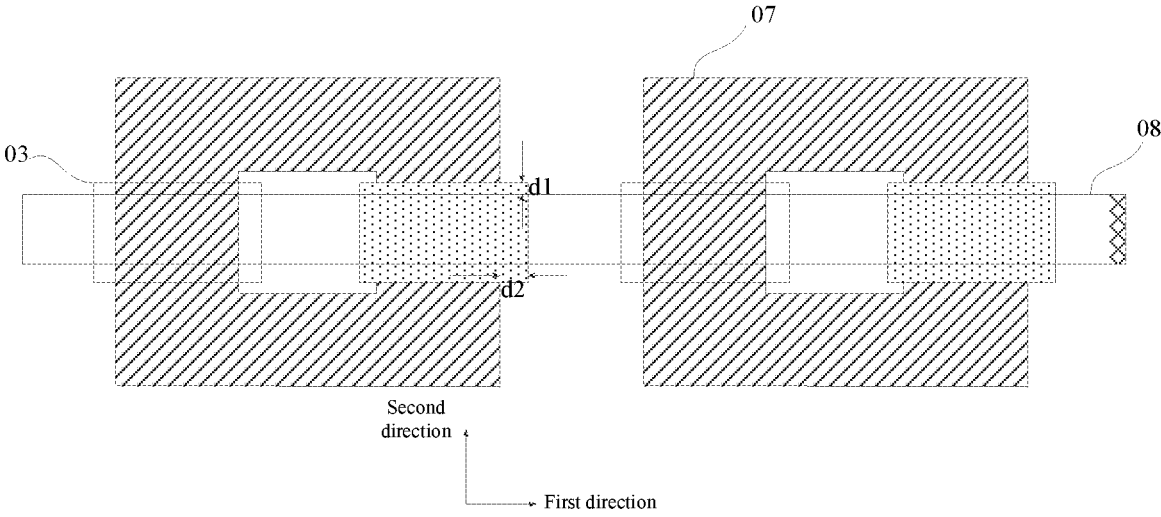
FIG. 8 and FIG. 9 are schematic enlarged views of portions in an oval box in FIG. 7.

In the GOA region, as shown in FIG. 7, a first clock signal line 07 intersects with a second clock signal line 08, and at a position of a via 06, the first clock signal line 07 and the second clock signal line 08 are connected through the via 06. In addition to the position of the via 06, an isolation pattern 03 is provided at the intersection position of the first clock signal line 07 and the second clock signal line 08, which can block the metal ion diffusion of the first clock signal line 07 and the second clock signal line 08, slow down the metal ion diffusion and chemical reaction between the intersecting metal signal lines due to the electric field, and ensure the product yield of the display substrate.

FIG. 8 is a schematic enlarged view of a position of an oval frame in FIG. 7. At the intersection position of the first clock signal line 07 and the second clock signal line 08, the first clock signal line 07 may include a hollowed-out region which divides the first clock signal line 07 into two independent first portions (the hollowed-out region may also divide the first clock signal line 07 into more than three independent first portions), each of the first portions corresponds to one of the isolation patterns 03, and a first orthographic projection of the first portion on the base substrate falls within a second orthographic projection of the corresponding isolation pattern on the base substrate.

Figure 9:
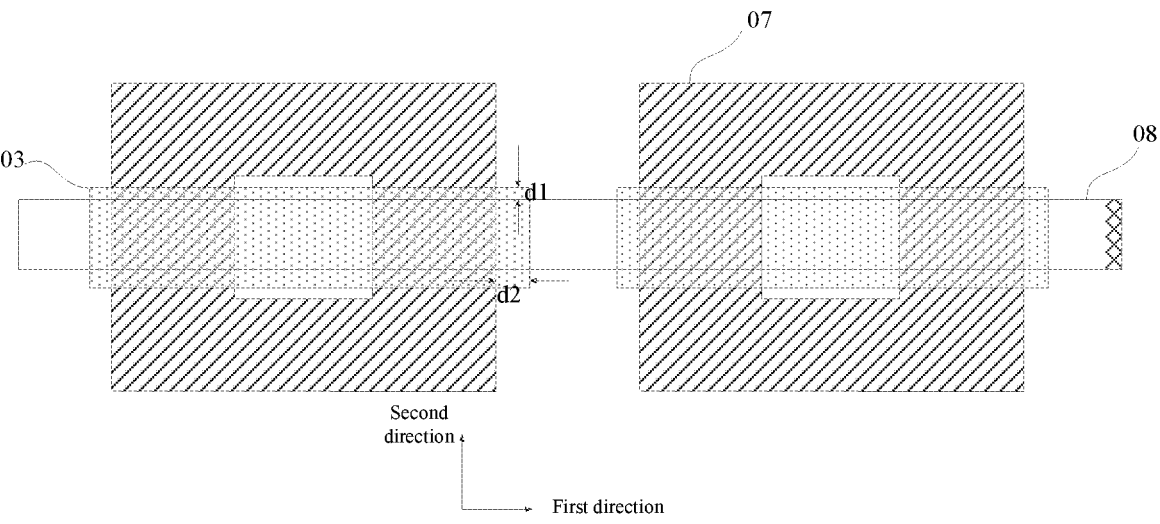

In order to simplify the manufacturing process, a plurality of isolation patterns corresponding to the same first signal line may be in a unitary structure, as shown in FIG. 9.

In a particular embodiment, the minimum distance d1 between the boundary of the first orthographic projection and the boundary of the second orthographic projection in the second direction may be 2.5-3.3 microns. In the first direction, the minimum distance d2 between the boundary of the first orthographic projection and the boundary of the second orthographic projection may be 4.5-5.05 microns. When the above dimensions are used, metal ion diffusion of the first clock signal line 07 and the second clock signal line 08 can be effectively blocked, metal ion diffusion and chemical reaction between crossing metal signal lines due to the action of an electric field can be slowed down, and the product yield of the display substrate can be ensured.

A display device is provided in the embodiments of the present disclosure, including the above display substrate.

The display device includes, but is not limited to: a radio frequency unit, a network module, an audio output unit, an input unit, a sensor, a display unit, a user input unit, an interface unit, a memory, a processor, and a power supply. It can be understood by those skilled in the art that the configuration of the display device described above is not intended to be limiting and that the display device may include more or fewer of the components described above, or some combinations of the components, or different arrangements of the components. In embodiments of the present disclosure, the display device includes, but are not limited to, a display, a cell phone, a tablet, a television, a wearable electronic, or a navigation display device.

The display device may include: any product or component with a display function, such as a television, a liquid crystal display, a digital photo frame, a mobile phone, or a tablet computer, where the display device further includes a flexible circuit board, a printed circuit board, and a back panel.

A method for manufacturing a display device is provided in the embodiments of the present disclosure, including:

forming a first signal line extending in a first direction on a base substrate;

forming a second signal line extending in a second direction on the base substrate, where the second signal line is arranged in a different layer from the first signal line, the second direction intersects with the first direction, the first signal line includes a first portion, and a first orthographic projection of the first portion on the base substrate is located within a orthographic projection of the second signal line on the base substrate; and forming an isolation pattern on a side of the first signal line away from the base substrate, where the isolation pattern is located on a side of the second signal line close to the base substrate, and the first orthographic projection is located in a second orthographic projection of the isolation pattern on the base substrate.

In this embodiment, an isolation pattern is provided between the first signal line and the second signal line, and the isolation pattern can block metal ion diffusion of the first signal line and the second signal line, slow down metal ion diffusion and chemical reaction between crossing metal signal lines due to the action of an electric field, and ensure the product yield of the display substrate.

Due to the good conductivity of Cu, signal lines of the display substrate are generally made of Cu, which include a first signal line and a second signal line. As shown in FIG. 2, in the related art, an insulating layer 03 is provided between a first signal line 01 and a second signal line 02 and the insulating layer 03 is generally made of silicon oxide, silicon nitride, or silicon oxynitride. Limited by a manufacturing process, thickness of the insulating layer 03 is relatively small, and metal ion diffusion occurs in the first signal line 01 and the second signal line 02, resulting in that the first signal line 01 and the second signal line 02 have a risk of a short circuit at an intersection position between the first signal line 01 and the second signal line 02. After the short circuit occurs, temperature at the intersection position of the signal lines will be increased, thus causing the insulating layer at the intersection position of the signal lines to be easily damaged, damaging sealing performance of the display substrate, water vapor easily invading, corroding the signal lines and causing chemical reactions, and water vapor also diffusing in the direction of the signal lines and reducing the product yield of the display substrate.

As shown in FIG. 3, in the present embodiment, an isolation pattern 03 is provided between the first signal line 01 and the second signal line 02, and the isolation pattern 03 has a certain thickness, which can block the metal ion diffusion of the first signal line 01 and the second signal line 02, slow down the metal ion diffusion and chemical reaction between crossing metal signal lines due to the action of an electric field, and ensure the product yield of the display substrate.

In some embodiments, the first signal line includes a second portion other than the first portion, and an orthographic projection of the second portion on the base substrate does not overlap with an orthographic projection of the second signal line on the base substrate. The orthographic projection of the first signal line at the intersection position of the signal lines on the base substrate is all located in the orthographic projection of the isolation pattern 03 on the base substrate. As shown in FIG. 1, the first orthographic projection of the first portion 011 (the portion inside the dotted line frame) on the base substrate is located in the orthographic projection of the isolation pattern 03 on the base substrate, and an area of the isolation pattern 03 is greater than an area of the first portion 011. As shown in FIG. 3, after metal ion diffusion occurs in the first signal line 01, metal ions are distributed on the isolation pattern 03. Since the area of the isolation pattern 03 is relatively large, the area of the isolation pattern 03 directly opposite the first signal line 01 is relatively large (compared with the area of the second signal line 02 directly opposite the first signal line 01), which can reduce a distribution density of metal ions and slow down the diffusion and chemical reaction of metal ions between crossing metal signal lines due to the action of an electric field. In contrast, after metal ion diffusion occurs in the second signal line 02, metal ions are distributed on the isolation pattern 03. Since the area of the isolation pattern 03 is relatively large, the area of the isolation pattern 03 directly opposite the second signal line 02 is relatively large (compared with the area of the first signal line 01 directly opposite the first signal line 01), which can reduce the distribution density of the metal ions can be reduced and slow down the diffusion and chemical reaction of the metal ions between crossing metal signal lines due to the action of the electric field.

As shown in FIG. 3, the isolation pattern 03 may be located between the insulating layer 04 and the second signal line 02: alternatively, as shown in FIG. 4, the isolation pattern 03 may be located between the insulating layer 04 and the first signal line 01 as long as the isolation pattern 03 is located between the first signal line 01 and the second signal line 02.

In order to ensure the waterproofness of the display substrate, the isolation pattern 03 may be made of a material having good waterproofness. In this embodiment, the isolation pattern 03 may be made of a semiconductor material, where the semiconductor material has a certain electron mobility. After the metal ions diffused in the signal lines reach the isolation pattern 03, the isolation pattern 03, as a semiconductor, may change electric field distribution, slow down the metal ion diffusion and chemical reaction between crossing metal signal lines due to the action of the electric field, avoid corrosion at the intersection position of the signal lines, and further avoid the diffusion of water vapor along the signal lines to ensure the yield of display products.

The isolation pattern 03 may be made of a metal oxide semiconductor, amorphous silicon, and polysilicon, and preferably, the isolation pattern 03 is made of a metal oxide semiconductor, such as IGZO, which has a good electron mobility and can effectively reduce electric field density at the intersection position of the signal lines.

In some embodiments, the an layer of the thin film transistor of the display substrate is arranged in the same layer and material as the isolation pattern 03, so that the active layer of the thin film transistor of the display substrate and the isolation pattern 03 can be formed by one patterning process, and there is no need to prepare the isolation pattern 03 by a special patterning process, the number of patterning processes for preparing the display substrate can be reduced, and production cost of the display substrate can be reduced. The thickness of the isolation pattern 03 may be the same as a thickness of the active layer of the thin film transistor, and the thickness of the isolation pattern 03 may also be adjusted. The thickness of the isolation pattern 03 is designed to be greater than the thickness of the active layer of the thin film transistor to better reduce the electric field density at the intersection position of the signal lines, and the thickness of the isolation pattern 03 is preferably not less than 100 nm.

In this embodiment, the signal lines may be in various shapes. As shown in FIG. 1, the first signal line 01 and the second signal line 02 may be in a straight-line shape. As shown in FIG. 5, the second signal line 02 may further include a plurality of hollowed-out regions 021 at the intersection position of the signal lines, and the first signal line may also include a plurality of hollowed-out regions at the intersection position of the signal lines to reduce a direct area between the signal lines, reduce the electric field density at the intersection position of the signal lines, slow down the metal ion diffusion and chemical reaction between crossing metal signal lines due to the action of an electric field, avoid corrosion at the intersection position of the signal lines, and further avoid the diffusion of water vapor along the signal lines to ensure the yield of the display products. As shown in FIG. 6, the second signal line 02 may also be in a serpentine shape at the intersection position of the signal lines.

In the present embodiment, the first signal line is a gate line and the second signal line is a data line: or the first signal line is a first clock signal line and the second signal line is a second clock signal line. The first signal line is not limited to the gate line and the first clock signal line, the second signal line is not limited to the data line and the second clock signal line, and the first signal line and the second signal line may be other signal lines.

In the display region, the gate line intersects with the data line, an isolation pattern 03 is provided at the intersection position of the gate line and the data line, which can block the metal ion diffusion of the gate line and the data line, slow down the metal ion diffusion and chemical reaction between crossing metal signal lines due to the effect of an electric field, and ensure the product yield of the display substrate.

In the GOA region, as shown in FIG. 7, a first clock signal line 07 intersects with a second clock signal line 08, and at a position of a via 06, the first clock signal line 07 and the second clock signal line 08 are connected through the via 06. In addition to the position of the via 06, an isolation pattern 03 is provided at the intersection position of the first clock signal line 07 and the second clock signal line 08, which can block the metal ion diffusion of the first clock signal line 07 and the second clock signal line 08, slow down the metal ion diffusion and chemical reaction between the intersecting metal signal lines due to the electric field, and ensure the product yield of the display substrate.

FIG. 8 is a schematic enlarged view of a position of an oval frame in FIG. 7. At the intersection position of the first clock signal line 07 and the second clock signal line 08, the first clock signal line 07 may include a hollowed-out region which divides the first clock signal line 07 into two independent first portions (the hollowed-out region may also divide the first clock signal line 07 into more than three independent first portions), each of the first portions corresponds to one of the isolation patterns 03, and a first orthographic projection of the first portion on the base substrate falls within a second orthographic projection of the corresponding isolation pattern on the base substrate.

In order to simplify the manufacturing process, a plurality of isolation patterns corresponding to the same first signal line may be in a unitary structure, as shown in FIG. 9.

It should be noted that the various embodiments described herein are described in a progressive manner with reference to the same or similar parts throughout the various embodiments, with each embodiment focusing on differences from the other embodiments. In particular, the embodiments are described more simply because they are approximately similar to the product embodiments, with reference to the partial description of the product embodiments.

Unless defined otherwise, technical or scientific terms used in the present disclosure shall have the ordinary meaning as understood by one of ordinary skill in the art to which this disclosure belongs. The use of "first", "second", and the like in the present disclosure does not denote any order, quantity, or importance, but rather is used to distinguish one element from another. The terms "comprising" or "comprises", and the like, means that the presence of an element or item preceding the word covers the presence of the element or item listed after the word and equivalents thereof, but does not exclude other elements or items. The terms "connected" or "connected", and the like are not limited to physical or mechanical connections, but may comprise electrical connections, whether direct or indirect. The terms "upper", "lower", "left", "right", and the like are used only to indicate relative positional relationships that may change accordingly when the absolute position of the object being described changes.

It should be understood that when an element such as a layer, film, region, or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the foregoing is directed to embodiments of the present disclosure, other and further embodiments of the present disclosure may be devised without departing from the basic scope thereof, and the scope thereof is determined by the claims that follow. Accordingly, the protection sought herein is as set forth in the claims below.

What is claimed is:

1. A display substrate, comprising:
a first signal line, located on a base substrate and extending in a first direction;
a second signal line, located on the base substrate and extending in a second direction, wherein the second signal line is arranged in a different layer from the first signal line, the second direction intersects with the first direction,
the first signal line consists of a first portion and a second portion, a first orthographic projection of the first portion on the base substrate is located within an orthographic projection of the second signal line on the base substrate, and an orthographic projection of the second portion on the base substrate does not overlap with the orthographic projection of the second signal line on the base substrate;
the display substrate further comprises:
an isolation pattern, located on a side of the first signal line away from the base substrate, wherein the isolation pattern is located on a side of the second signal line close to the base substrate, and the first orthographic projection is located in a second orthographic projection of the isolation pattern on the base substrate,
wherein in the second direction, a boundary of the second orthographic projection exceeds a boundary of the first orthographic projection and the minimum distance between the boundary of the first orthographic projection and the boundary of the second orthographic projection is from 2.5 to 3.3 microns, and
wherein an active layer of a thin film transistor of the display substrate is arranged in the same layer as the isolation pattern, and both the active layer and the isolation pattern are made of a metal oxide semiconductor indium gallium zinc oxide (IGZO).

2. The display substrate according to claim 1, further comprises:
an insulating layer, located between the first signal line and the second signal line,
wherein the isolation pattern is located on a side of the insulating layer close to the base substrate; or
the isolation pattern is located on a side of the insulating layer away from the base substrate.

3. The display substrate according to claim 1, wherein the isolation pattern is made of a semiconductor material.

4. The display substrate according to claim 3, wherein the isolation pattern is made of a metal oxide semiconductor.

5. The display substrate according to claim 1, wherein

12 in the first direction, the boundary of the second orthographic projection exceeds the boundary of the first orthographic projection and the minimum distance between the boundary of the first orthographic projection and the boundary of the second orthographic projection is from 4.5 to 5.05 microns.

6. The display substrate according to claim 1, wherein
the first portion comprises a plurality of first sub-portions which are independent from each other, the isolation pattern comprises a plurality of sub-isolation patterns which are independent from each other, each of the first sub-portions corresponds to one of plurality of the sub-isolation patterns, a first sub-orthographic projection of one first sub-portion on the base substrate falls within a second sub-orthographic projection of the corresponding sub-isolation pattern on the base substrate, and a plurality of sub-isolation patterns corresponding to the same first signal line are integrally structured.

7. The display substrate according to claim 1, wherein
the first signal line is a gate line and the second signal line is a data line; or
the first signal line is a first clock signal line and the second signal line is a second clock signal line.

8. A display device, comprising a display substrate, the display substrate comprises:
a first signal line, located on a base substrate and extending in a first direction;
a second signal line, located on the base substrate and extending in a second direction, wherein the second signal line is arranged in a different layer from the first signal line, the second direction intersects with the first direction,
the first signal line consists of a first portion and a second portion, a first orthographic projection of the first portion on the base substrate is located within an orthographic projection of the second signal line on the base substrate, and an orthographic projection of the second portion on the base substrate does not overlap with the orthographic projection of the second signal line on the base substrate;
the display substrate further comprises:
an isolation pattern, located on a side of the first signal line away from the base substrate, wherein the isolation pattern is located on a side of the second signal line close to the base substrate, and the first orthographic projection is located in a second orthographic projection of the isolation pattern on the base substrate,
wherein in the second direction, a boundary of the second orthographic projection exceeds a boundary of the first orthographic projection and the minimum distance between the boundary of the first orthographic projection and the boundary of the second orthographic projection is from 2.5 to 3.3 microns, and
wherein an active layer of a thin film transistor of the display substrate is arranged in the same layer as the isolation pattern, and both the active layer and the isolation pattern are made of a metal oxide semiconductor indium gallium zinc oxide (IGZO).

9. The display device according to claim 8, wherein the display substrate further comprises:
an insulating layer, located between the first signal line and the second signal line,
wherein the isolation pattern is located on a side of the insulating layer close to the base substrate; or
the isolation pattern is located on a side of the insulating layer away from the base substrate.

10. The display device according to claim 8, wherein the isolation pattern is made of a semiconductor material.

11. The display device according to claim 10, wherein the isolation pattern is made of a metal oxide semiconductor.

12. The display device according to claim 10, wherein an active layer of a thin film transistor of the display substrate is arranged in the same layer and material as the isolation pattern.

13. The display device according to claim 8, wherein in the first direction, the boundary of the second orthographic projection exceeds the boundary of the first orthographic projection and the minimum distance between the boundary of the first orthographic projection and the boundary of the second orthographic projection is from 4.5 to 5.05 microns.

14. A method for manufacturing a display substrate, comprising:

forming a first signal line extending in a first direction on a base substrate;

forming a second signal line extending in a second direction on the base substrate, wherein the second signal line is arranged in a different layer from the first signal line, the second direction intersects with the first direction, the first signal line consists of a first portion and a second portion, a first orthographic projection of the first portion on the base substrate is located within an orthographic projection of the second signal line on the base substrate, and an orthographic projection of the second portion on the base substrate does not overlap with the orthographic projection of the second signal line on the base substrate; and forming an isolation pattern on a side of the first signal line away from the base substrate, wherein the isolation pattern is located on a side of the second signal line close to the base substrate, and the first orthographic projection is located in a second orthographic projection of the isolation pattern on the base substrate, wherein in the second direction, a boundary of the second orthographic projection exceeds a boundary of the first orthographic projection and the minimum distance between the boundary of the first orthographic projection and the boundary of the second orthographic projection is from 2.5 to 3.3 microns, and wherein an active layer of a thin film transistor of the display substrate is arranged in the same layer as the isolation pattern, and both the active layer and the isolation pattern are made of a metal oxide semiconductor indium gallium zinc oxide (IGZO).

15. The method for manufacturing a display substrate according to claim 14, comprising:

forming an active layer of a thin film transistor of the display substrate and the isolation pattern by one patterning process.

\* \* \* \* \*